(12) United States Patent
Kuo

(10) Patent No.: US 11,115,063 B2
(45) Date of Patent: Sep. 7, 2021

(54) FLASH MEMORY CONTROLLER, STORAGE DEVICE AND READING METHOD

(71) Applicant: Silicon Motion, Inc., Jhubei (TW)

(72) Inventor: Shiuan-Hao Kuo, New Taipei (TW)

(73) Assignee: SILICON MOTION, INC., Jhubei (TW)

( * ) Notice: Subject to any disclaimer, the term of this patent is extended or adjusted under 35 U.S.C. 154(b) by 30 days.

(21) Appl. No.: 16/835,863

(22) Filed: Mar. 31, 2020

(65) Prior Publication Data
US 2021/0083688 A1 Mar. 18, 2021

(30) Foreign Application Priority Data
Sep. 18, 2019 (TW) ................................. 108133512

(51) Int. Cl.
*H03M 13/37* (2006.01)
*H03M 13/11* (2006.01)
*H03M 13/00* (2006.01)
*H03M 13/15* (2006.01)

(52) U.S. Cl.
CPC .... *H03M 13/3738* (2013.01); *H03M 13/1114* (2013.01); *H03M 13/1117* (2013.01); *H03M 13/1575* (2013.01); *H03M 13/6318* (2013.01); *H03M 13/3746* (2013.01)

(58) Field of Classification Search
CPC ......... H03M 13/1137; H03M 13/3738; H03M 13/1131; H03M 13/1117; H03M 13/3746; H03M 13/1114
See application file for complete search history.

(56) References Cited

U.S. PATENT DOCUMENTS

| 8,732,543 | B1 | 5/2014 | Yang | |
|---|---|---|---|---|
| 9,325,347 | B1 * | 4/2016 | Graumann | ......... H03M 13/1137 |
| 9,467,171 | B1 * | 10/2016 | Varnica | .............. H03M 13/1128 |
| 9,755,665 | B1 * | 9/2017 | Chilappagari | ..... H03M 13/1105 |
| 10,038,456 | B1 * | 7/2018 | Nguyen | ............. H03M 13/1131 |
| 10,200,064 | B1 * | 2/2019 | Varnica | ................ H03M 13/116 |

(Continued)

OTHER PUBLICATIONS

Jianjun Zhang, Da Wang and Ye Jin, "Energy-efficient LDPC layered decoder," 2013 IEEE 4th International Conference on Electronics Information and Emergency Communication, Beijing, China, 2013, pp. 53-56.*

*Primary Examiner* — Steve N Nguyen

(74) *Attorney, Agent, or Firm* — McClure, Qualey & Rodack, LLP

(57) ABSTRACT

A flash memory controller is configured to decode a codeword. During the decoding process, the flash memory can check the decoding status of each codeword segment in the codeword and skip the decoding of a codeword segment whose decoding status is passed, thereby saving time decoding and also improving decoding efficiency. Even though only a part of the codeword segments in the codeword have been successfully decoded in the decoding process at the previous time, the flash memory controller can replace the part of the codeword segments in the codeword with the correct results obtained previously, and then decoding the re-formed codeword again. Accordingly, the decoding accuracy can be increased and the burden on the subsequent decoding process or data recovery can be reduced.

19 Claims, 7 Drawing Sheets

(56) References Cited

U.S. PATENT DOCUMENTS

| | | | |
|---|---|---|---|
| 2014/0223256 A1* | 8/2014 | Sakai | G06F 11/1012 714/758 |
| 2015/0180511 A1* | 6/2015 | Ish-Shalom | H03M 13/1128 714/776 |
| 2018/0041227 A1* | 2/2018 | Lee | H03M 13/2948 |
| 2018/0351577 A1 | 12/2018 | Qin et al. | |
| 2019/0207630 A1* | 7/2019 | Tate | H03M 13/43 |

* cited by examiner

FLASH MEMORY CONTROLLER, STORAGE DEVICE AND READING METHOD

CROSS REFERENCE TO RELATED APPLICATIONS

This application claims priority of Taiwan Patent Application No. 108133512, filed on Sep. 18, 2019, the entirety of which is incorporated by reference herein.

BACKGROUND OF THE INVENTION

Field of the Invention

The present invention relates to an LDPC (low-density parity check) technology, and more particularly to a flash memory controller, a storage device and a reading method that can save the decoding time.

Description of the Related Art

Flash memory can be electronically erased and written, or programmed, for data storage. It is therefore widely used in memory cards, solid state drives (SSDs), portable multimedia players, and so on. However, during the process of data access, data is often damaged due to certain factors. In order to achieve high reliability and high efficient transmission quality, error correction codes play a pivotal role in the process of data access.

In recent years, LDPC (low-density parity check) code has attracted much attention because of its excellent correction ability, and thus it can often be used for data encoding and decoding. However, as the length of the LDPC code is longer, the decoding time required in decoding process will increase accordingly. This means that the waiting time for data response is too long and the delay increases.

BRIEF SUMMARY OF THE INVENTION

In an embodiment, a flash memory controller used to access a flash memory includes a read-only memory, a processor and an error correction code unit. The read-only memory is configured to store a code. The processor is configured to execute the code to control access to the flash memory. The error correction code unit includes an LDPC (low-density parity check) decoder which is configured to perform a decoding process. The LDPC decoder includes a variable-node circuit, a check-node circuit, a segment detection circuit, a syndrome check circuit and a control circuit. The variable-node circuit is configured to generate a plurality of variable-node messages according to a plurality of channel values of a plurality of codeword segments of a first codeword. Furthermore, the variable-node circuit skips a plurality of first variable-node messages of the plurality of variable-node messages according to a decoding indication, and performs a variable-node calculation according to a plurality of second variable-node messages and a plurality of check-node messages, so as to update the plurality of second variable-node messages. Wherein, the plurality of second variable-node messages are the variable-node messages in the plurality of variable-node messages that are not the plurality of first variable-node messages, each of the codeword segments corresponds to multiple ones of the plurality of variable-node messages, and the plurality of first variable-node messages correspond to a codeword segment whose decoding status is passed. The check-node circuit is configured to perform a check-node calculation according to the plurality of variable-node messages so as to generate and update the plurality of check-node messages. The segment detection circuit is configured to detect each of the codeword segments according to the variable-node messages that correspond to each of the codeword segments, so as to generate and update the corresponding decoding status of each of the codeword segments. The syndrome check circuit is configured to determine whether the first codeword is successfully decoded according to the plurality of check-node messages. The control circuit is configured to check whether the decoding status of each of the codeword segments is passed, and generate the decoding indication when it is found that the decoding status of one of the codeword segments is failed. Moreover, the control circuit is configured to increase a recursive number by one when completing one iteration of the check-node calculation and one iteration of the variable-node calculation each time. Furthermore, when the syndrome check circuit determines that the first codeword is successfully decoded, the control circuit enables the variable-node circuit to output a decoding result.

In an embodiment, a storage device includes a flash memory and a flash memory controller. The flash memory controller is configured to access the flash memory. The flash memory controller includes a read-only memory, a processor and an error correction code unit. The read-only memory is configured to store a code. The processor is configured to execute the code to control access to the flash memory. The error correction code unit includes an LDPC decoder which is configured to perform a decoding process. The LDPC decoder includes a variable-node circuit, a check-node circuit, a segment detection circuit, a syndrome check circuit, and a control circuit. The variable-node circuit is configured to generate a plurality of variable-node messages according to a plurality of channel values of a plurality of codeword segments of a first codeword. Furthermore, the variable-node circuit skips a plurality of first variable-node messages of the plurality of variable-node messages according to a decoding indication, and performs a variable-node calculation according to a plurality of second variable-node messages and a plurality of check-node messages, so as to update the plurality of second variable-node messages. Wherein, the plurality of second variable-node messages are the variable-node messages in the plurality of variable-node messages that are not the plurality of first variable-node messages, each of the codeword segments corresponds to multiple ones of the plurality of variable-node messages, and the plurality of first variable-node messages correspond to a codeword segment whose decoding status is passed. The check-node circuit is configured to perform a check-node calculation according to the plurality of variable-node messages so as to generate and update the plurality of check-node messages. The segment detection circuit is configured to detect each of the codeword segments according to the variable-node messages that correspond to each of the codeword segments, so as to generate and update the corresponding decoding status of each of the codeword segments. The syndrome check circuit is configured to determine whether the first codeword is successfully decoded according to the plurality of check-node messages. The control circuit is configured to check whether the decoding status of each of the codeword segments is passed, and generate the decoding indication when it is found that the decoding status of one of the codeword segments is failed. Moreover, the control circuit is configured to increase a recursive number by one when completing one iteration of the check-node calculation and one iteration of the variable-node calculation each time. Furthermore, when the syndrome check circuit determines that the first codeword is successfully decoded, the control circuit enables the variable-node circuit to output a decoding result.

In an embodiment, a reading method includes: reading a first codeword from a flash memory according to a read command; and performing a decoding process. The decoding process includes: generating a plurality of variable-node messages according to a plurality of channel values of a plurality of codeword segments of the first codeword, wherein each codeword segment corresponds to multiple ones of the plurality of variable-node messages; detecting each of the codeword segments according to the variable-node messages corresponding to each of the codeword segments, so as to generate and update a decoding status corresponding to each of the codeword segments; checking whether the decoding status of each of the codeword segments is passed; when finding that the decoding status of one of the codeword segments is failed, generating a decoding indication; skipping a plurality of first variable-node messages of the variable-node messages according to the decoding indication, and performing a variable-node calculation according to a plurality of second variable-node messages and a plurality of check-node messages, so as to update the plurality of second variable-node messages, wherein the plurality of second variable-node messages are the variable-node messages in the plurality of variable-node messages that are not the plurality of first variable-node messages, and the plurality of first variable-node messages correspond to a codeword segment whose decoding status is passed; performing a check-node calculation according to the plurality of variable-node messages so as to generate and update the plurality of check-node messages; increasing a recursive number by one when completing one iteration of the check-node calculation and one iteration of the variable-node calculation each time; determining whether the first codeword is successfully decoded according to the results of the check-node calculation; and when determining that the first codeword is successfully decoded, outputting a decoding result.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

In order to make the above objects, features and advantages of the embodiments of the present invention easier to understand, a detailed description is given in the following embodiments with reference to the accompanying drawings.

Figure 1:
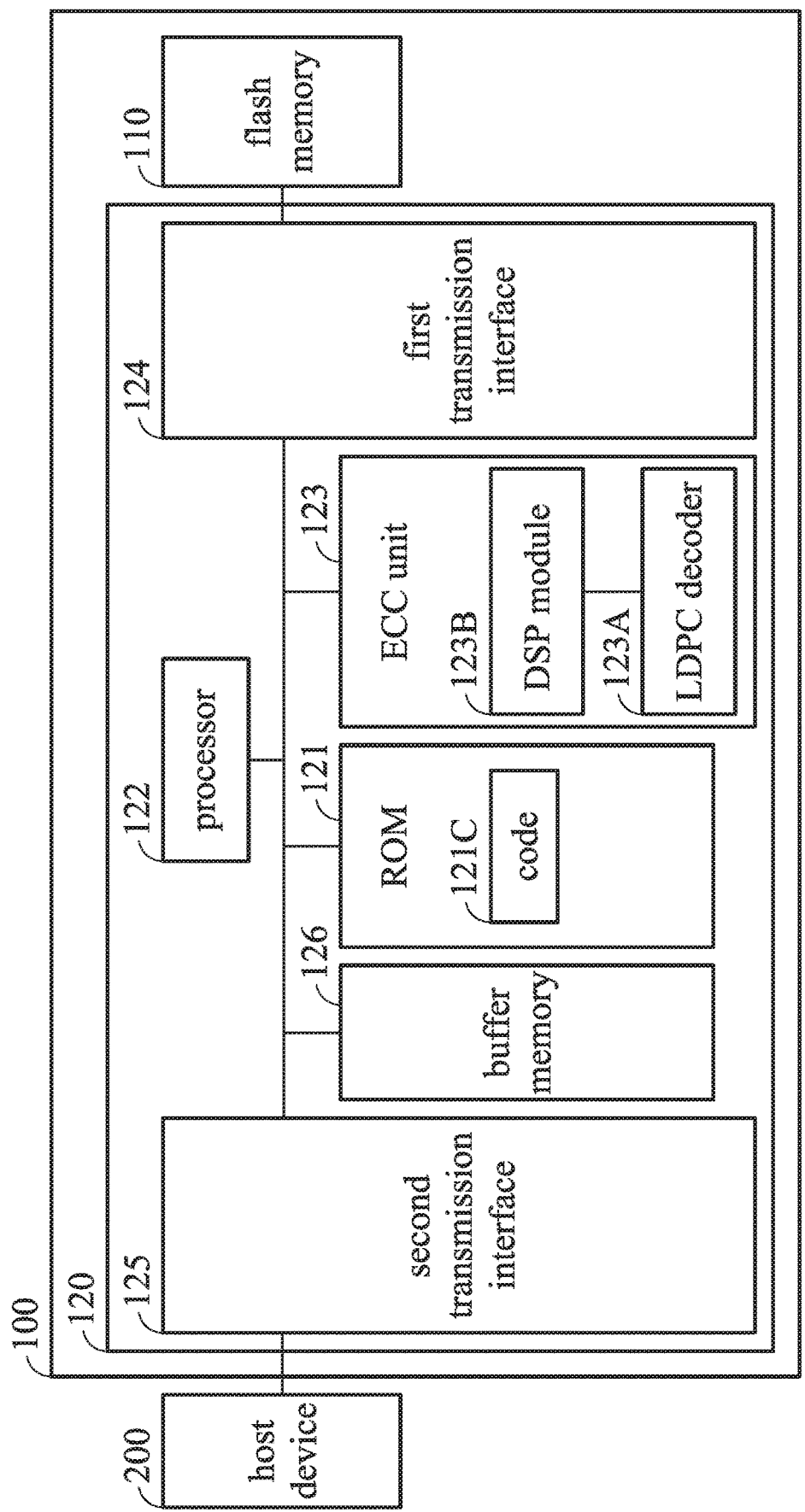
FIG. 1 is a block diagram illustrating an embodiment of a storage device coupled to a host device.

FIG. 1 is a block diagram illustrating an embodiment of a storage device coupled to a host device. Please refer to FIG. 1. A storage device 100 can be coupled to a host device 200. In some implementations, the storage device 100 may be a memory card, and the host device 200 may be any one of various devices that are configured with a card reader, such as a computer, a cell phone, or a camera, but it is not limited thereto. In other implementations, the storage device 100 may be a solid state drive (SSD), and the host device 200 may be a computer or a host computer, but it is not limited thereto.

In an embodiment, the storage device 100 includes a flash memory 110 and a flash memory controller 120, and the flash memory controller 120 is coupled to the flash memory 110. The flash memory 110 is configured to store various types of data, such as multimedia files, and the flash memory controller 120 can access the flash memory 110.

In an embodiment, the flash memory controller 120 can include a read-only memory (ROM) 121, a processor 122 and an error correction code (ECC) unit 123. Furthermore, the flash memory controller 120 may further include at least two transmission interfaces (hereinafter referred to as a first transmission interface 124 and a second transmission interface 125) and at least one buffer memory 126. Herein, the processor 122 is coupled to the read-only memory 121, the error correction code unit 123, the first transmission interface 124, the second transmission interface 125 and the buffer memory 126.

In some implementations, the processor 122 can be coupled to the read-only memory 121, the error correction code unit 123, the first transmission interface 124, the second transmission interface 125 and the buffer memory 126 via a bus. The first transmission interface 124 and the second transmission interface 125 can be a USB (Universal Serial Bus) interface, an ATA (Advanced Technology Attachment) interface, a SATA (Serial ATA) interface, a PCI-E (Peripheral Component Interconnect-Express) interface and so on. Furthermore, the processor 122 may be a CPU (Central Processing Unit), a MCU (micro-processor), a DSP (Digital Signal Processor), a PLD (Programmable Logic Device) or another similar circuit component, but the present invention is not limited thereto.

The read-only memory 121 can be used to store a code 121C. However, the present invention is not limited thereto. The code 121C can also be stored in the buffer memory 126 or another type of memory. The processor 122 can control the read-only memory 121, the error correction code unit 123, the first transmission interface 124, the second transmission interface 125, and the buffer memory 126 by executing the code 121C. For example, accessing the flash memory 110 through the first transmission interface 124, using the buffer memory 126 to perform the required buffer operation, communicating with the host device 200 which is coupled to the storage device 100 through the second transmission interface 125, using the error correction code unit 123 to perform encoding and decoding, and so on.

The error correction code unit 123 can use an LDPC (low-density parity check) code to decode data read from the flash memory 110, and to encode data written into the flash memory 110. Herein, the error correction code unit 123 includes an LDPC decoder 123A, and the error correction code unit can use the LDPC decoder to decode the data read from the flash memory 110.

Figure 2:
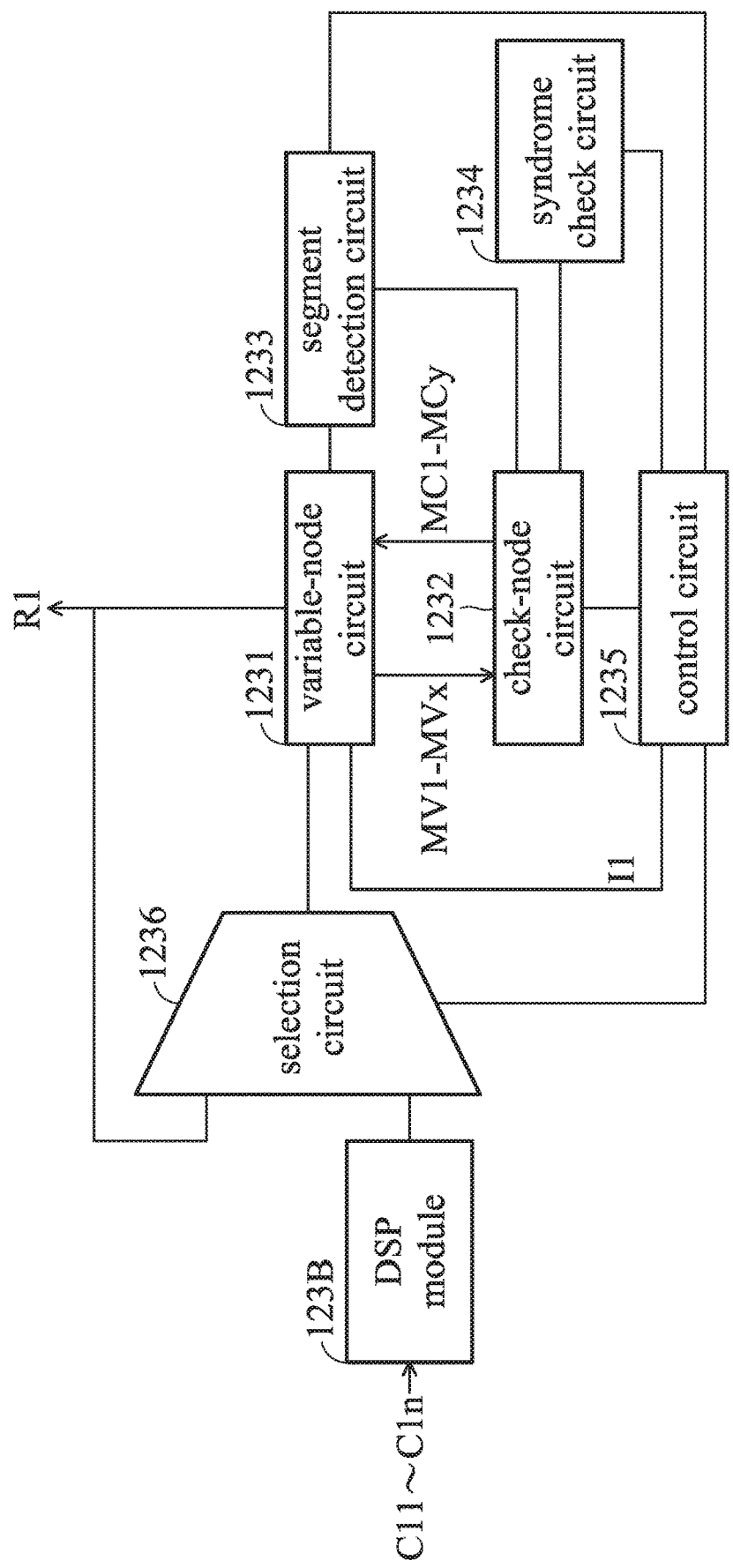
FIG. 2 is a block diagram illustrating an embodiment of an error correction code unit in FIG. 1.

FIG. 2 is a block diagram illustrating an embodiment of the error correction code unit 123 in FIG. 1. Please refer to FIG. 2. In an embodiment, the LDPC decoder 123A of the error correction code unit 123 may include a variable-node circuit 1231, a check-node circuit 1232, a segment detection circuit 1233, a syndrome check circuit 1234 and a control circuit 1235. The variable-node circuit 1231 is coupled to the check-node circuit 1232 and the segment detection circuit 1233. The check-node circuit 1232 is coupled to the segment detection circuit 1233 and the syndrome check circuit 1234. The control circuit 1235 is coupled to the variable-node circuit 1231, the segment detection circuit 1233 and the syndrome check circuit 1234. Furthermore, the LDPC decoder 123A may further include a selection circuit 1236, and the selection circuit 1236 is coupled to a digital signal processing (DSP) module 123B, the variable-node circuit 1231 and the control circuit 1235.

Figure 3:
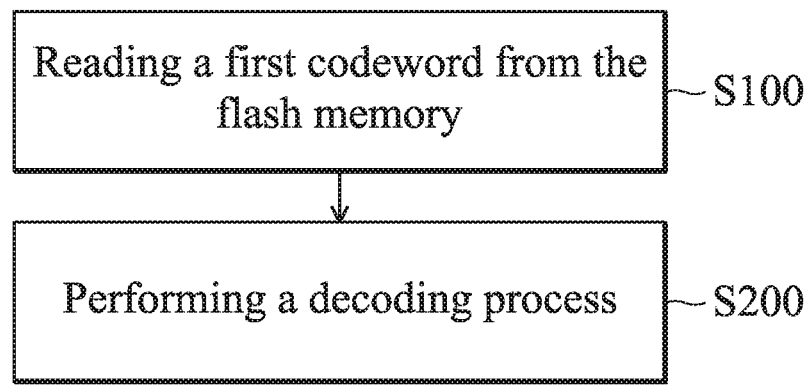
FIG. 3 is a flowchart illustrating an embodiment of the reading method.
Figure 4A:
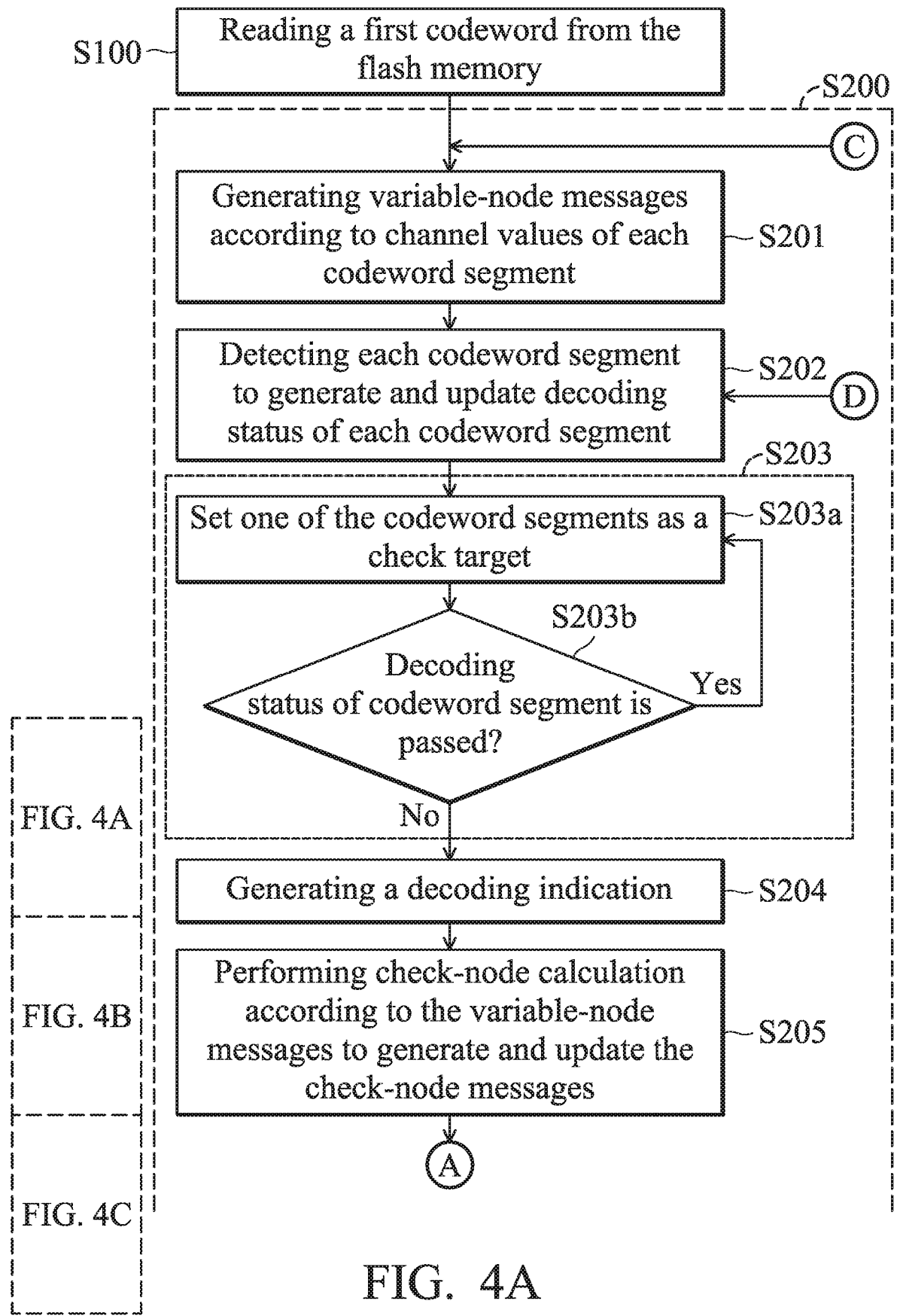
FIG. 4A to FIG. 4C are a flowchart illustrating an embodiment of step S200 in FIG. 3.
Figure 4B:
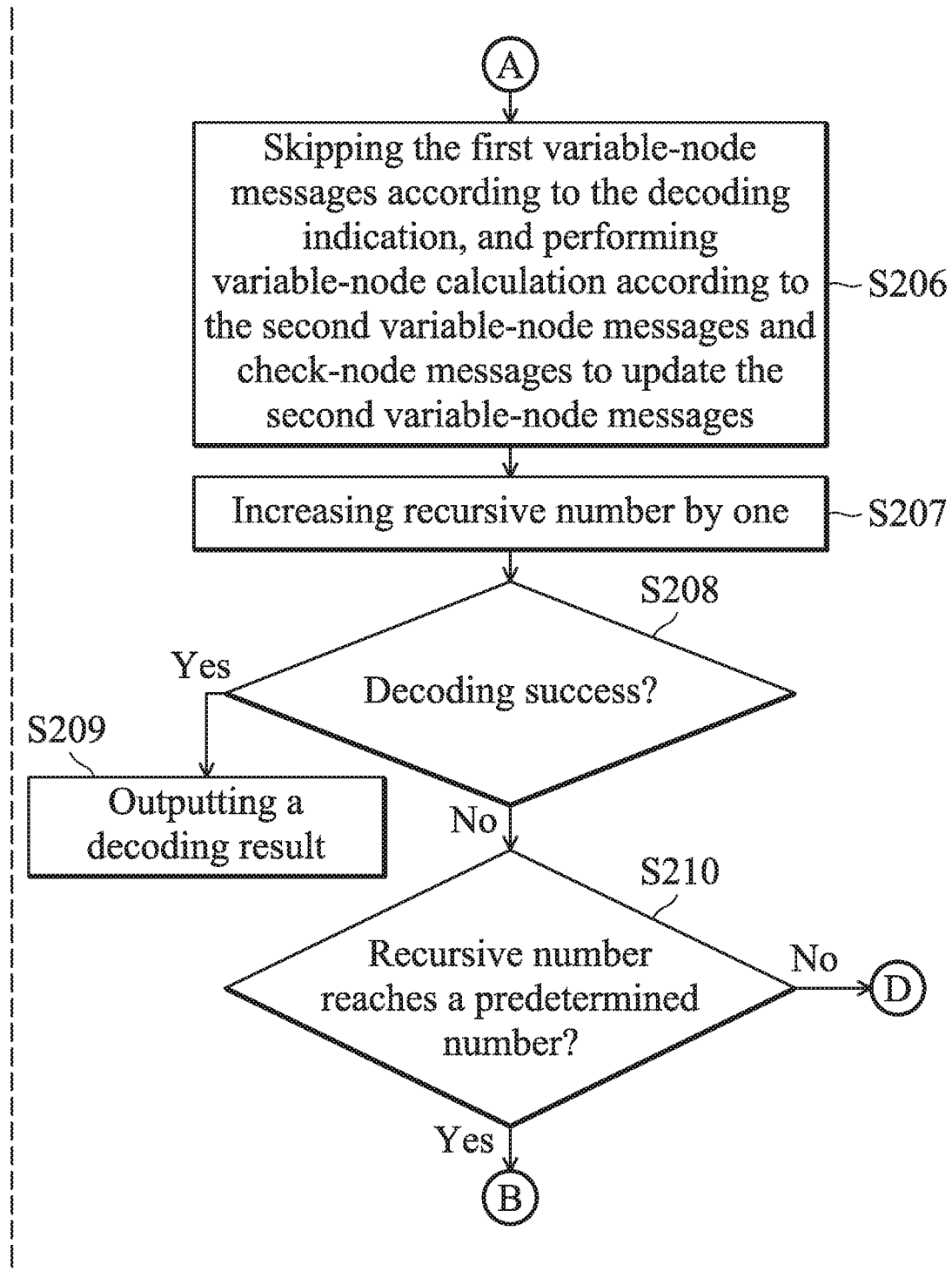
Figure 4C:
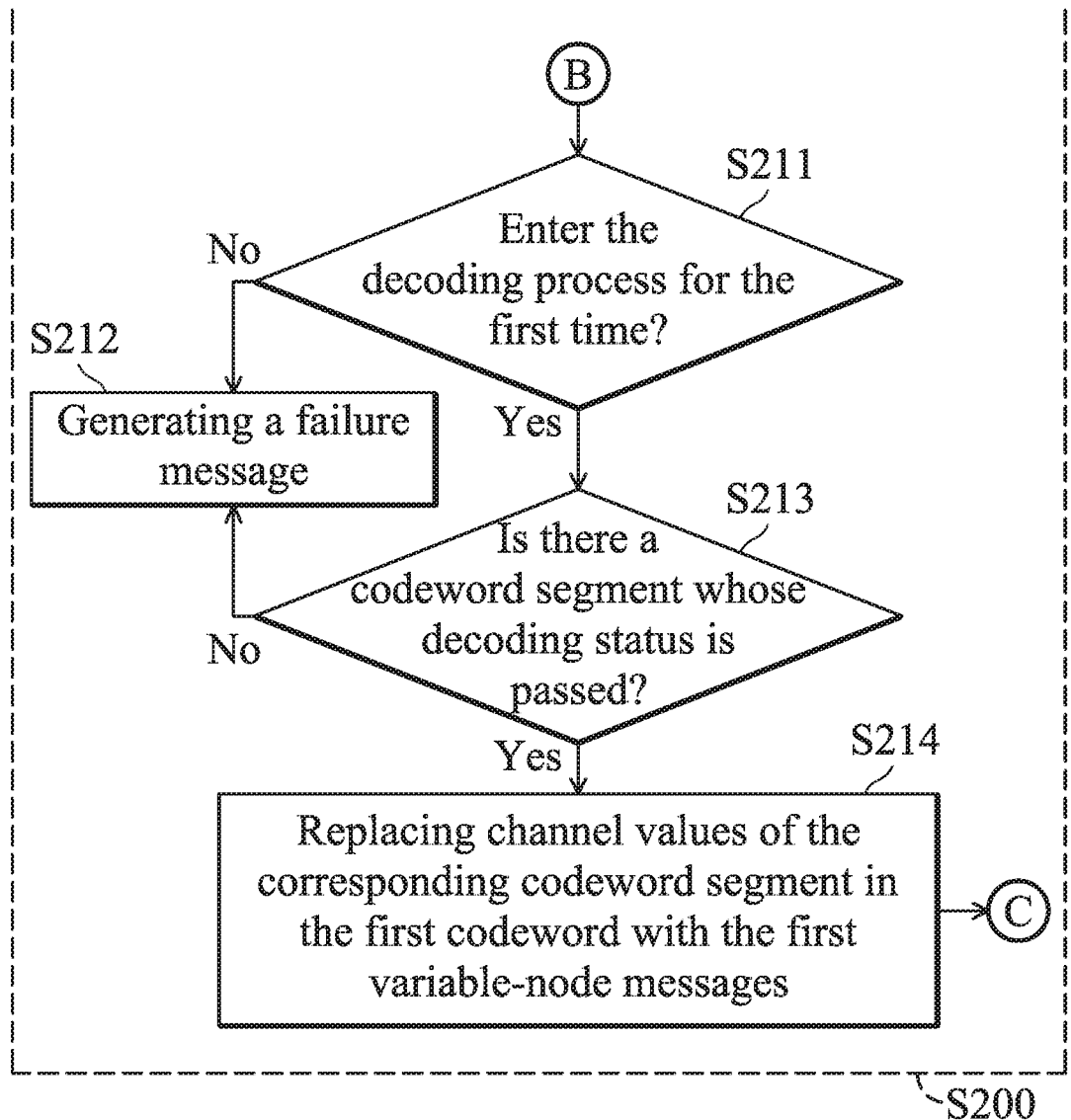

FIG. 3 is a flowchart illustrating an embodiment of the reading method, and FIG. 4A to FIG. 4C are a flowchart illustrating an embodiment of step S200 in FIG. 3. Please refer to all the figures from FIG. 1 to FIG. 4C. The flash memory controller 120 of any embodiment of the present invention can read data stored in the flash memory 110 and decode it according to the reading method of any embodiment.

When the flash memory controller 120 receives a read command from the host device 200 through the second transmission interface 125, the flash memory controller 120 can read a first codeword C1 from a specific physical address of the flash memory 110 according to a logical address recorded in the read command by using the processor 122 (step S100). After that, the flash memory controller 120 can use the LDPC decoder 123A to perform a decoding process according to the first codeword C1 read in the step S100 (step S200).

In an embodiment of step 100, the first codeword C1 could be divided into a plurality of codeword segments C11-C1$n$, and each of the codeword segments C11-C1$n$ has the ability to be individually verified for correctness. Moreover, these codeword segments C11-C1$n$ can be divided before being stored in the flash memory 110. The error correction code unit 123 may further include a digital signal processing module 123B, and the digital signal processing module 123B is coupled to the LDPC decoder 123A. Herein, the flash memory controller 120 can use the processor 122 to read the plurality of codeword segments C11-C1$n$ of the first codeword C1 located on the specific physical address according to the read command, and use the digital signal processing module 123B of the error correction code unit 123 to calculate reliability information of each bit of each of the codeword segments C11-C1$n$, thereby converts out corresponding channel values of each of the codeword segments C11-C1$n$. Wherein, each channel value can be used to represent one bit in the codeword segment. Therefore, the number of channel values is the same as the number of bits contained in the codeword segment. Herein, the number of bits in each of the codeword segments C11-C1$n$ may be the same as each other. However, the present invention is not limited thereto. The number of bits in each of the codeword segments C11-C1$n$ may also be different from each other.

In some implementations, each channel value may only include a sign bit. However, the present invention is not limited thereto. In other implementations, in addition to the sign bit, each channel value may further include at least one reliability bit.

In an embodiment of the decoding process in step S200, the LDPC decoder 123A can use the selection circuit 1236 to switch the input source of the variable-node circuit 1231 to the output of the digital signal processing module 123B, so as to sequentially load the plurality of channel values read by the digital signal processing module 123B from each of the codeword segments C11-C1$n$ of the first codeword C1 into the variable-node circuit 1231. After that, the LDPC decoder 123A can use the variable-node circuit 1231 to generate a plurality of variable-node messages MV1-MVx according to the plurality of channel values of these codeword segments C11-C1$n$ (step S201). Wherein, each of the codeword segments C11-C1$n$ can correspond to a plurality of variable-node messages in these variable-node messages MV1-MVx. Herein, each of the variable-node messages MV1-MVx can be used to represent one bit information of the first codeword C1. Therefore, the number of variable-node messages corresponding to each of the codeword segments C11-Cn is the same as the number of channel values contained in each of the codeword segments C11-C1$n$, and that is a one-to-one relationship.

In some implementations, when the channel value only includes a sign bit, the corresponding variable-node message also only includes sign information. While when the channel value further includes reliability bit(s), in addition to the sign information, the corresponding variable-node message also further includes reliability information.

Subsequently, the LDPC decoder 123A can use the segment detection circuit 1233 to separately detect each of the codeword segments C11-C1$n$ according to the variable-node messages corresponding to each codeword segment, and to generate and update a corresponding decoding status of each codeword segment according to its detection result (step S202). Herein, when detected that a codeword segment is decoded correctly, the segment detection circuit 1233 can record a decoding status of this codeword segment as passed. Conversely, when detected that a codeword segment has not been decoded correctly, the segment detection circuit 1233 can record a decoding status of this codeword segment as failed.

Figure 5:
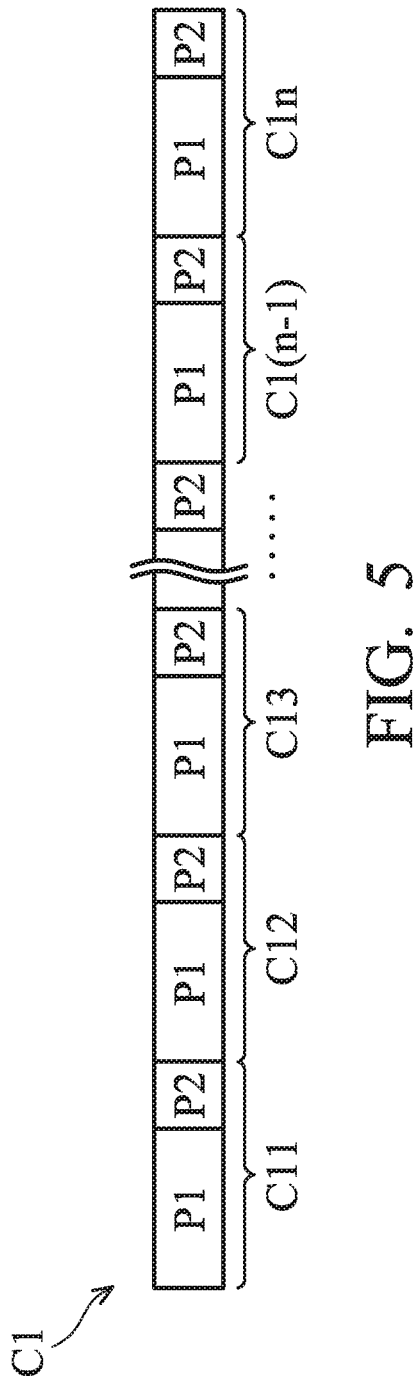
FIG. 5 is a schematic diagram illustrating an embodiment of a first codeword.

In an embodiment, each of the codeword segments C11-C1$n$ may include a codeword part P1 and a check part P2, as shown in FIG. 5. Furthermore, in step S202, the segment detection circuit 1233 can detect whether the variable-node messages corresponding to the codeword part P1 of each of the codeword segments C11-Cn have been decoded correctly through the variable-node messages corresponding to the check part P2 of each codeword segment. In some implementations, the check part P2 of each of the codeword segments C11-Cn may be a kind of cyclic redundancy check (CRC) code, but the present invention is not limited thereto.

In another embodiment, each of the codeword segments C11-C1$n$ may not include a check part P2 (i.e., only includes a codeword part P1). Moreover, in step S202, the segment detection circuit 1233 can detect whether each of the codeword segments C11-C1$n$ has been decoded correctly by separately using a check formula which only includes the corresponding variable-node messages of each of the codeword segments C11-C1$n$. For example, the segment detection circuit 1233 can determine according to whether a result value of the check formula is zero after the corresponding variable-node messages of the codeword segment being brought into the check formula. When the result value is zero, it represents that this codeword segment has been decoded correctly. On the contrary, when the result value is not zero, it represents that this codeword segment has not been decoded correctly. In some implementations, the segment detection circuit 1233 can obtain check formulas for detecting the codeword segments C11-C1$n$ from the check-node circuit 1232.

In some embodiments, when the first codeword C1 enters the LDPC decoder 123A for the first time, since it does not undergone any recursive decoding process, the segment detection circuit 1233 at this time will record the decoding status of each of the codeword segments C11-C1n as failed.

Subsequently, the LDPC decoder 123A can use the control circuit 1235 to check whether the decoding status of each of the codeword segments C11-C1n obtained by the segment detection circuit 1233 in step S202 is passed (step S203). In an embodiment of step S203, the control circuit 1235 may first set one of the codeword segments C11-C1n as a check target (step S203a), and then check whether the decoding status of this codeword segment which is set as the check target is passed (step S203b). In an embodiment of step S203a, the control circuit 1235 may sequentially set the check target according to a composition order of these codeword segments C11-Cn in the first codeword C1, but the present invention is not limited thereto.

Herein, when the control circuit 1235 determines that the decoding status of the codeword segment being currently checked is passed in the step S203b, the control circuit 1235 can return to step S203a and use another one of these codeword segments C11-C1n as a new check target. Furthermore, when the control circuit 1235 checks that the decoding status of any codeword segment is failed, the control circuit 1235 can generate a decoding indication I1 to the variable-node circuit 1231 (step S204), so that the variable-node circuit 1231 can perform decoding according to the decoding indication I1. Herein, the content of the decoding indication I1 may include all codeword segments whose decoding status is passed, such that the variable-node circuit 1231 can know which codeword segments that current decoding status is passed.

In an embodiment of step S203, the control circuit 1235 can sequentially check each of the codeword segments C11-C1n according to the composition order of these codeword segments C11-Cn in the first codeword C1, but the present invention is not limited thereto.

In an embodiment, after receiving the decoding indication I1, the variable-node circuit 1231 can first transmit all the variable-node messages MV1-MVx to the check-node circuit 1232, such that the check-node circuit 1232 can perform a check-node calculation according to these variable-node messages MV1-MVx to generate a plurality of check-node messages MC1-MCy, and update the check-node messages MC1-MCy output to the variable-node circuit 1231 (step S205). In some implementations, the check-node circuit 1232 can use a plurality of check formulas to perform the check-node calculation, and separately decide each of the check-node messages MC1-MCy transmitted to the variable-node circuit 1231 according to whether the sum of the variable-node messages included in each check formula is zero. Through this, the variable-node circuit 1231 can be informed that what value should be of each of the variable-node messages MV1-MVx though by the check-node circuit 1232.

After receiving the check-node messages MC-MCy, since the variable-node circuit 1231 has learned which codeword segment whose current decoding status is passed according to the decoding indication I1, and learned that the variable-node messages corresponding to the codeword segments whose decoding status is passed (hereinafter referred to as a plurality of first variable-node messages) are correct and do not need to be updated. Therefore, the variable-node circuit 1231 can skip these first variable-node messages according to the decoding indication I1, and performs a variable-node calculation only according to the check-node messages MC1-MCy updated by the check-node circuit 1232 and the variable-node messages corresponding to the codeword segments whose decoding status is failed (i.e., the remaining variable-node messages, hereinafter referred to as a plurality of second variable-node messages), so as to update these second variable-node messages according to the results of the variable-node calculation (step S206). In this way, much decoding time can be saved.

After completing updating these second variable-node messages, the variable-node circuit 1231 can further transmit all the variable-node messages MV1-MVx to the check-node circuit 1232. Wherein, each time after the check-node circuit 1232 completes one iteration of check-node calculation and the variable-node circuit 1231 completes one iteration of variable-node calculation, the control circuit 1235 can increase a recursive number by one (step S207), so as to count out how much times the first codeword C1 has undergone the decoding process. Moreover, the syndrome check circuit 1234 can determine whether the first codeword C1 is successfully decoded according to the results of the check-node calculation performed by the check-node circuit 1232. Herein, the syndrome check circuit 1234 can determine according to the plurality of check formulas used by the check-node circuit 1232. For example, when the values obtained from these check formulas after the check-node calculation are all zero, the syndrome check circuit 1234 can determine that the first codeword C1 is successfully decoded.

When the syndrome check circuit 1234 determines that the first codeword C1 is successfully decoded in the step S208, the syndrome check circuit 1234 can generate a signal to inform the control circuit 1235, so that the control circuit 1235 accordingly generate a trigger signal to the variable-node circuit 1231, and the variable-node circuit 1231 can output a decoding result R1 according to the current variable-node messages MV1-MVx after receiving the trigger signal (step S209). For example, the decoding result R1 is transmitted to the host device 200 through the second transmission interface 125 to complete the execution of the read command.

When the determination result of the syndrome check circuit 1234 in the step S208 is that the decoding of the first codeword C1 fails, the control circuit 1235 can further confirm whether the counted recursive number has reached a predetermined number (step S210). Wherein, the predetermined number is a preset maximum number for recursive decoding, such as 10 times, 100 times, etc., and its value is not limited thereto.

When the confirmation result of the control circuit 1235 in the step S210 is that the recursive number has not reached the predetermined number, the decoding process can return back to the step S202 to update the current decoding status of each of the codeword segments C11-C1n, and then continue again the steps subsequent to the step S202.

When the confirmation result of the control circuit 1235 in the step S210 is that the recursive number reached the predetermined number, the control circuit 1235 can further confirm whether this is the first time that the first codeword C1 enters this decoding process (step S211), so as to provide another decoding opportunity to the first codeword C1. Assuming that the confirmation result of the control circuit 1235 is that this is not the first time that the first codeword C1 enters the decoding process, the control circuit 1235 can generate a failure message to the processor 122 to inform the decoding is failed (step S212). Assuming that the confirmation result of the control circuit 1235 is that this is the first time that the first codeword C1 enters the decoding process, the control circuit 1235 can further confirm whether there is any codeword segment whose decoding status has been recorded to passed in the plurality of codeword segments C11-C1*n* after the first codeword undergone first time of decoding process (i.e., the recursive number has reached the predetermined number but the decoding still fails) (step S213).

Figure 6:
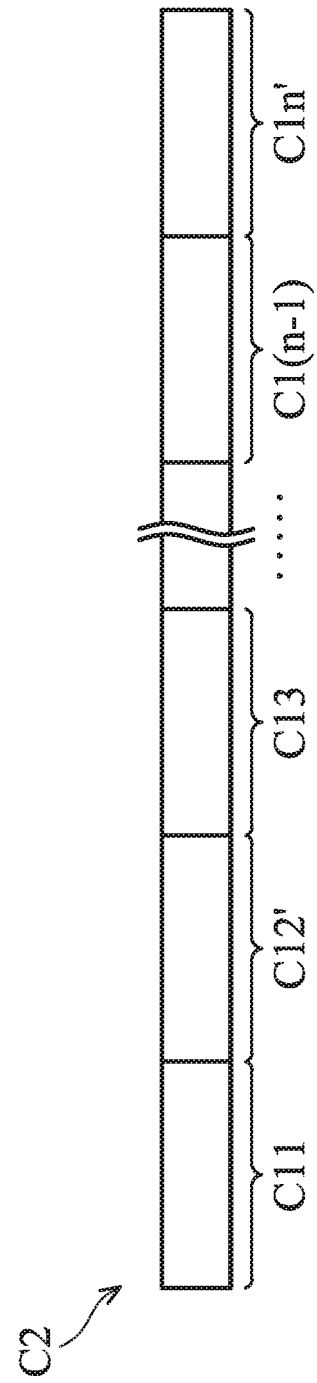
FIG. 6 is a schematic diagram illustrating an embodiment of a second codeword.

When the confirmation result of the control circuit 1235 in the step S213 is that there is no codeword segment whose decoding status is passed in these codeword segments C11-C1*n*, the control circuit 1235 performs the step S212 to generate the failure message to inform the processor 122 that the decoding is failed. However, when the confirmation result of the control circuit 1235 in the step S213 is that there is at least one of codeword segment whose decoding status is passed in these codeword segments C11-C1*n*, the control circuit 1235 can use the plurality of first variable-node messages obtained in the first iteration of decoding process to replace the plurality of channel values of the corresponding codeword segments (i.e., the codeword segments whose decoding status is passed) in the first codeword C, so as to reassemble this first codeword C1 into a new second codeword C2 (step S214). For example, assuming that the decoding statuses of codeword segment C12 and codeword segment C1*n* are passed, the control circuit 1235 can separately replace the channel values of the codeword segments C12 and C1*n* with the corresponding first variable-node messages, thereby codeword segment C12' and codeword segment C1*n*' are generated, and the second codeword C2 is composed of the codeword segment C11, codeword segment C12', codeword segment C13 . . . codeword segment C1(*n*−1) and codeword segment C1'*n*, as shown in FIG. 6.

Thereafter, the LDPC decoder 123A returns back to the step S200 to restart the decoding process according to this second codeword C2 (i.e., entering step S201 based on the second codeword C2). Wherein, the recursive number counted in the previous decoding process will be reset in this restarted decoding process, but the decoding status of each of the codeword segments will not be cleared.

In this way, after the first codeword C1 is reassembled to be the second codeword C2 in the step S214, the resolvability will be improved, thereby reducing the burden on the subsequent decoding process or data recovery. Moreover, since the codeword segment whose decoding status is passed in the second codeword C2 can also be skipped in the restarted decoding process, the decoding time required for the second decoding iteration is reduced again.

In an embodiment of step S214, since the channel values of each of the codeword segments C11-C1*n* are input to the variable-node circuit 1231 in a sequential manner, therefore, when it is desired to input the codeword segment whose decoding status is passed to the variable-node circuit 1231, the control circuit 1235 can input the corresponding first variable-node message to the variable-node circuit 1231 by the input switching of the selection circuit 1236, and when it is desired to input the codeword segment whose decoding status is failed into the variable-node circuit 1231, the control circuit 1235 can input the original channel values of this codeword segment to the variable-node circuit 1231 by the input switching of the selection circuit 1236, so as to reassemble out a second codeword C2. However, the present invention is not limited thereto. In some implementations, the selection circuit 1236 may be implemented by a multiplexer.

In an embodiment of reading method, when the processor 122 receives the failure message, the flash memory controller 120 can further return back to perform the step S100 according to this failure message, so as to use the processor 122 to read the first codeword C1 from the specific physical address in the flash memory 110 again.

In some implementations, the variable-node circuit 1231 and the check-node circuit 1232 may be implemented in fully-parallel architecture, sequential architecture or partially-parallel architecture. Herein, the implementation of the variable-node circuit 1231 and the check-node circuit 1232 are well known to those with ordinary skill in the art, and so it will not be described in detail.

In some embodiments, any one embodiment of the flash memory controller 120 can be integrated in a chip by a plurality of integrated circuit manufacturing methods, but the present invention is not limited thereto.

It is worth to know that, compared to the traditional decoding manner that recursively decodes entire codeword directly, any one embodiment of the error correction code unit 123 in the present invention can skip the codeword segment whose decoding status has been passed in the process of recursive decoding due to the characteristic of segment decoding. In this way, the decoding time required for the entire codeword by the error correction code unit 123 in any one embodiment of the present invention can be greatly reduced. Furthermore, compared with the traditional decoding manner that still use original entire codeword to again perform the recursive decoding after the first decoding iteration fails, the error correction code unit 123 in any one embodiment of the present invention will first replace a part of codeword segments in the codeword with the correct results reported previously, and then uses the reassembled codeword to perform the recursive decoding again. In this way, any one embodiment of the error correction code unit 123 in the present invention can further improve the decoding accuracy, and reduce the burden on the subsequent decoding process or data recovery.

As described above, in the decoding process, any one embodiment of the present invention provides a flash memory controller, a storage device and a reading method that confirms whether there is a codeword segment whose decoding status is passed in the codeword, such that the codeword segment whose decoding status is passed can be skipped in the subsequent recursive decoding process, so as to save the decoding time and improve the efficiency of decoding. Furthermore, any one embodiment of the present invention provides a flash memory controller, a storage device and a reading method can further replace a part of codeword segments with the correct results reported previously, and then uses the reassembled codeword to perform the recursive decoding again, so as to improve the decoding accuracy, and reduce the burden on the subsequent decoding process or data recovery.

The features of the embodiments described above will allow persons having ordinary skill in the art to clearly appreciate the form of the present specification. Persons having ordinary skill in the art will appreciate that the objectives and/or the advantages of the above embodiments can be accomplished in a way that is consistent with the above embodiments by designing or modifying other processes and structures based on the content of the present disclosure. Persons having ordinary skill in the art will also appreciate that equivalent constructions can be modified, substituted or retouched without departing from the scope and spirit of the present invention.

What is claimed is:

1. A flash memory controller, configured to access a flash memory, the flash memory controller comprises:
a read-only memory, configured to store a code;

a processor, configured to execute the code to control access to the flash memory; and an error correction code unit, comprising an LDPC (low-density parity check) decoder, the LDPC decoder is configured to perform a decoding process, and the LDPC decoder comprises:

a variable-node circuit, configured to generate a plurality of variable-node messages according to a plurality of channel values of a plurality of codeword segments of a first codeword, the variable-node circuit skips a plurality of first variable-node messages of the plurality of variable-node messages according to a decoding indication, and the variable-node circuit performs a variable-node calculation according to a plurality of second variable-node messages and a plurality of check-node messages, so as to update the plurality of second variable-node messages, wherein the plurality of second variable-node messages are the variable-node messages in the plurality of variable-node messages that are not the plurality of first variable-node messages, each of the codeword segments corresponds to multiple ones of the plurality of variable-node messages, and the plurality of first variable-node messages correspond to a codeword segment whose decoding status is passed;

a check-node circuit, configured to perform a check-node calculation according to the plurality of variable-node messages so as to generate and update the plurality of check-node messages;

a segment detection circuit, configured to detect each of the codeword segments according to the variable-node messages that correspond to each of the codeword segments, so as to generate and update the corresponding decoding status of each of the codeword segments;

a syndrome check circuit, configured to determine whether the first codeword is successfully decoded according to results of the check-node calculation; and a control circuit, configured to check whether the decoding status of each of the codeword segments is passed, and to generate the decoding indication when it is found that the decoding status of one of the codeword segments is failed, the control circuit increases a recursive number by one when completing one iteration of the check-node calculation and one iteration of the variable-node calculation each time, and the control circuit enables the variable-node circuit to output a decoding result when the syndrome check circuit determines that the first codeword is successfully decoded.

2. The flash memory controller as claimed in claim 1, wherein when the syndrome check circuit determines that the first codeword is not successfully decoded, the control circuit confirms whether the recursive number has reached a predetermined number, and when confirming that the recursive number has not reached the predetermined number, the control circuit re-checks the decoding result of each of the codeword segments, so as to update the decoding indication according to a re-check result.

3. The flash memory controller as claimed in claim 2, wherein when confirming that the recursive number has reached the predetermined number, the control circuit confirms whether the first codeword has entered the decoding process for the first time, and when confirming that this is the first time, the control circuit confirms whether there is a codeword segment whose decoding status is passed in the plurality of codeword segments, when there is a codeword segment whose decoding status is passed, the control circuit replaces the channel values of the codeword segment whose decoding status is passed in the first codeword with the first variable-node messages obtained in the first iteration of the decoding process, so as to generate a second codeword, and the control circuit enables the LDPC decoder to again perform the decoding process according to the second codeword.

4. The flash memory controller as claimed in claim 3, wherein when confirming that this is not the first time or when the decoding status of each of the codeword segments are all failed after the recursive number has reached the predetermined number, the control circuit generates a failure message.

5. The flash memory controller as claimed in claim 1, wherein each of the codeword segments comprises a codeword part and a check part, the segment detection circuit detects each of the codeword segments according to the check part of each of the codeword segments.

6. The flash memory controller as claimed in claim 1, wherein the segment detection circuit separately detects each of the codeword segments according to a check formula that only comprises one of the codeword segments.

7. A storage device, comprising:

a flash memory; and a flash memory controller, configured to access the flash memory, wherein the flash memory controller comprises:

a read-only memory, configured to store a code;

a processor, configured to execute the code to control access to the flash memory; and an error correction code unit, comprising an LDPC (low-density parity check) decoder, the LDPC decoder is configured to perform a decoding process, and the LDPC decoder comprises:

a variable-node circuit, configured to generate a plurality of variable-node messages according to a plurality of channel values of a plurality of codeword segments of a first codeword, the variable-node circuit skips a plurality of first variable-node messages of the plurality of variable-node messages according to a decoding indication, and the variable-node circuit performs a variable-node calculation according to a plurality of second variable-node messages and a plurality of check-node messages, so as to update the plurality of second variable-node messages, wherein the plurality of second variable-node messages are the variable-node messages in the plurality of variable-node messages that are not the plurality of first variable-node messages, each of the codeword segments corresponds to multiple ones of the plurality of variable-node messages, and the plurality of first variable-node messages correspond to a codeword segment whose decoding status is passed;

a check-node circuit, configured to perform a check-node calculation according to the plurality of variable-node messages so as to generate and update the plurality of check-node messages;

a segment detection circuit, configured to detect each of the codeword segments according to the variable-node messages that correspond to each of the codeword segments, so as to generate and update the corresponding decoding status of each of the codeword segments;

a syndrome check circuit, configured to determine whether the first codeword is successfully decoded according to results of the check-node calculation; and a control circuit, configured to check whether the decoding result of each of the codeword segments is passed, and to generate the decoding indication when it is found that the decoding status of one of the codeword segments is failed, the control circuit increases a recursive number by one when completing one iteration of the check-node calculation and one iteration of the variable-node calculation each time, and the control circuit enables the variable-node circuit to output a decoding result when the syndrome check circuit determines that the first codeword is successfully decoded.

8. The storage device as claimed in claim 7, wherein when the syndrome check circuit determines that the first codeword is not successfully decoded, the control circuit confirms whether the recursive number has reached a predetermined number, and when confirming that the recursive number has not reached the predetermined number, the control circuit re-checks the decoding result of each of the codeword segments, so as to update the decoding indication according to a re-check result.

9. The storage device as claimed in claim 8, wherein when confirming that the recursive number has reached the predetermined number, the control circuit confirms whether the first codeword has entered the decoding process for the first time, and when confirming that this is the first time, the control circuit confirms whether there is a codeword segment whose decoding status is passed in the plurality of codeword segments, and when there is a codeword segment whose decoding status is passed, the control circuit replaces the channel values of the codeword segment whose decoding status is passed in the first codeword with the first variable-node messages obtained in the first iteration of the decoding process, so as to generate a second codeword, and the control circuit enables the LDPC decoder to again perform the decoding process according to the second codeword.

10. The storage device as claimed in claim 9, wherein when confirming that this is not the first time or when the decoding status of each of the codeword segments are all failed after the recursive number has reached the predetermined number, the control circuit generates a failure message.

11. The storage device as claimed in claim 7, wherein each of the codeword segments comprises a codeword part and a check part, the segment detection circuit detects each of the codeword segments according to the check part of each of the codeword segments.

12. The storage device as claimed in claim 7, wherein the segment detection circuit separately detects each of the codeword segments according to a check formula that only comprises one of the codeword segments.

13. A reading method, comprising:
reading a first codeword from a flash memory according to a read command; and
performing a decoding process, wherein the decoding process comprises:
generating a plurality of variable-node messages according to a plurality of channel values of a plurality of codeword segments of the first codeword, wherein each codeword segment corresponds to multiple ones of the plurality of variable-node messages;
detecting each of the codeword segments according to the variable-node messages corresponding to each of the codeword segments, so as to generate and update a decoding status corresponding to each of the codeword segments;
checking whether the decoding status of each of the codeword segments is passed;
when finding that the decoding status of one of the codeword segments is failed, generating a decoding indication;
skipping a plurality of first variable-node messages of the variable-node messages according to the decoding indication, and performing a variable-node calculation according to a plurality of second variable-node messages and a plurality of check-node messages, so as to update the plurality of second variable-node messages, wherein the plurality of second variable-node messages are the variable-node messages in the plurality of variable-node messages that are not the plurality of first variable-node messages, and the plurality of first variable-node messages correspond to a codeword segment whose decoding status is passed;
performing a check-node calculation according to the plurality of variable-node messages so as to generate and update the plurality of check-node messages;
increasing a recursive number by one when completing one iteration of the check-node calculation and one iteration of the variable-node calculation each time;
determining whether the first codeword is successfully decoded according to results of the check-node calculation; and
when determining that the first codeword is successfully decoded, outputting a decoding result.

14. The reading method as claimed in claim 13, further comprising:
when determining that the first codeword is not successfully decoded, confirming whether the recursive number has reached a predetermined number; and
when confirming that the recursive number has not reached the predetermined number, returning to perform the step of detecting each of the codeword segments according to the variable-node messages corresponding to each of the codeword segments, so as to generate and update the decoding status corresponding to each of the codeword segments.

15. The reading method as claimed in claim 14, further comprising:
when confirming that the recursive number has reached the predetermined number, confirming whether the first codeword has entered the decoding process for the first time;
when confirming that this is the first time, confirming whether there is a codeword segment whose decoding status is passed in the plurality of codeword segments;
when there is a codeword segment whose decoding status is passed, replacing the channel values of the codeword segment whose decoding status is passed in the first codeword with the first variable-node messages obtained in the first iteration of the decoding process, so as to generate a second codeword; and
again performing the decoding process according to the second codeword.

16. The reading method as claimed in claim 15, further comprising:
when confirming that this is not the first time, generating a failure message; and when the decoding status of each of the codeword segments are all failed after the recursive number has reached the predetermined number, generating the failure message.

17. The reading method as claimed in claim 16, further comprising:
returning to perform the step of reading the first codeword from the flash memory according to the read command.

18. The reading method as claimed in claim 13, wherein each of the codeword segments comprises a codeword part and a check part, and the step of detecting each of the codeword segments according to the variable-node messages corresponding to each of the codeword segments is to detect according to the check part of each of the codeword segments.

19. The reading method as claimed in claim 13, wherein the step of detecting each of the codeword segments according to the variable-node messages corresponding to each of the codeword segments is to separately detect each of the codeword segments according to a check formula that comprises the codeword segment.

* * * * *